United States Patent [19]

Allen et al.

[11] 4,370,610
[45] Jan. 25, 1983

[54] LOCATING SHEATH FAULTS IN UNDERGROUND POWER SUPPLY CABLES

[75] Inventors: Kenneth R. Allen, Longwood; John K. Allen, Huddersfield; Gordon G. McNally, Fenay Bridge, all of England

[73] Assignee: Bicc Public Limited Company, London, England

[21] Appl. No.: 69,855

[22] Filed: Aug. 27, 1979

[30] Foreign Application Priority Data

Aug. 30, 1978 [GB] United Kingdom ............... 34935/78

[51] Int. Cl.³ .......................................... G01R 31/08
[52] U.S. Cl. ............................................. 324/52
[58] Field of Search .................. 324/52, 54, 66, 67; 179/175.3 F

[56] References Cited

U.S. PATENT DOCUMENTS

| 689,254 | 12/1901 | Varley | 324/52 |
|---|---|---|---|
| 1,297,929 | 3/1919 | Taylor | 324/52 |
| 3,076,931 | 2/1963 | Jasper | 324/67 X |
| 3,588,802 | 6/1971 | Lerwill | 324/67 X |
| 3,701,940 | 10/1972 | Nilsson | 324/257 |
| 3,745,452 | 7/1973 | Osburn et al. | 324/54 |
| 3,792,350 | 2/1974 | Bossler et al. | 324/52 |
| 3,924,179 | 12/1975 | Dozier | 324/67 X |
| 3,991,363 | 11/1976 | Lathrop | 324/52 |
| 4,039,938 | 8/1977 | Link | 324/54 X |
| 4,074,188 | 2/1978 | Boatman et al. | 324/52 |

FOREIGN PATENT DOCUMENTS

| 1148652 | 11/1963 | Fed. Rep. of Germany. | |
|---|---|---|---|
| 1231808 | 1/1967 | Fed. Rep. of Germany. | |
| 2138108 | 4/1972 | Fed. Rep. of Germany. | |
| 2351318 | 4/1974 | Fed. Rep. of Germany. | |
| 934098 | 8/1963 | United Kingdom | 324/52 |

OTHER PUBLICATIONS

Clegg et al., Modern Cable-Fault-Location Methods Proc. IEE, vol. 122, No. 4, Apr. 1975, pp. 397-402.

Primary Examiner—Gerard R. Strecker
Attorney, Agent, or Firm—Buell, Blenko, Ziesenheim & Beck

[57] ABSTRACT

In the location of an earth fault on a sheath of an underground cable, pulses of direct current are applied to the sheath at one location on the cable. A search is made at spaced locations along the cable route for the magnetic field due to a fault current to earth flowing in the sheath which is produced by the applied d.c. pulses using a portable magnetometer, with a visual indicator, and, at each of said spaced locations, the visual indications on the magnetometer are compared with the periods of application of the pulses to the sheath until they correspond. Comparison of the visual indications with the periods of application of the pulses is facilitated by transmitting signals indicative of the periods of current application and using, with the portable magnetometer, a portable receiver arranged to receive the transmitted signals so that the visual indications can be compared with the received signals.

10 Claims, 2 Drawing Figures

LOCATING SHEATH FAULTS IN UNDERGROUND POWER SUPPLY CABLES

This invention relates to the location of sheath faults to earth on fully insulated underground power supply cables.

In such a cable, the core conductors, normally three conductors for the three phases, are separately insulated and are surrounded by further insulation with a metal sheath which in turn is surrounded by an outer insulating sheath. The detection of sheath faults to earth can be a difficult and time-consuming operation. The usual procedure is to use a bridge location technique although this is often difficult to apply and sometimes impossible because of the inaccessibility or unavailability of connections to a sound core conductor for comparison purposes. The pool of potential method which may be used for more precise location after a bridge test and which is sometimes the only technique possible, requires the application of a d.c. current to the sheath, usually as coded pulses, and the detection of surface level voltage gradients in the ground between two probes. Detection of faults or long cable routes by this method alone is very laborious as there may be no information as to where to start probing.

It is an object of the present invention to provide an improved method of and apparatus for locating an earth fault on a sheath of an underground cable.

According to the invention, in a method of locating an earth fault on a sheath of an underground cable by applying pulses of direct current to the sheath at one location on the cable, a search is made at spaced locations along the route of the cable for the magnetic field due to a fault current to earth flowing in the sheath which is produced by the applied d.c. pulses using a portable magnetometer, with a visual indicator, and, at each of said spaced locations the visual indications on the magnetometer are compared with periods of application of the pulses to the sheath by transmitting signals indicative of the periods of current application and using, with the portable magnetometer, a portable receiver aranged to receive the transmitted signals so that the magnetometer indications can be compared with the received signals until said visual indications and said periods of application of the pulses substantially correspond, therebey identifying the approximate position of the earth fault along the cable.

One of the problems of using a magnetometer to detect a magnetic field due to a fault current arises because a very sensitive magnetometer has to be used to detect the minute amount of flux from a current of 50 mA passing through the cable sheath in a cable which may be 1 to 1½ meters deep. The magnetometer has to be adjusted to compensate for stray magnetic fields in the vicinity. Varying magnetic fields are commonly present, for example from passing traffic. Increasing the current may increase the burning effect and hence damage the cable at the point of fault. This is a matter of some concern as the fault could be on the barrier insulation at a cable joint. With the method of the present invention the magnetometer operator receives signals indicative of the current pulses and hence can compare the indications given by the magnetometer with the applied pulses; consequently, a greater current than normally employed can be used for a shorter period of time. This greatly assists in detecting and recognizing the field due to the fault current. It has been found that very small deviations can be picked out from much larger simultaneous random deviations when the precise instant of a pulse is known.

Preferably the pulses comprise a plurality of uniformly spaced pulses of uniform duration, e.g. three pulses of one second duration spaced one second apart. It is found, in practice, that such pulses can be detected in quite heavy traffic conditions.

The signals indicative of the periods of current application might be transmitted over a core or cores of the cable. It is more convenient however to transmit these signals by a radio transmitter and in this case, the receiver is a radio receiver.

Other synchronization techniques may be employed, for example the use of synchronized quartz clocks. In the following description, however, reference will be made more particularly to the use of a radio link which is particularly convenient, since conventional radio communication equipment may be employed without modification.

Preferably the radio receiver is arranged to produce audio frequency pulses coincident with the applied d.c. pulses. It is convenient therefore to have an audio signal generator, e.g. a buzzer, at said one location so enabling a conventional radio transmitter and receiver to be used to transmit the required information to the magnetometer operator.

Considered from another aspect, the invention includes within its scope apparatus for locating an earth fault on a sheath of an underground cable by applying pulses of direct current to the sheath, which apparatus includes means for producing synchronizing signals coincident with the pulses. Preferably, the means for producing said synchronizing signals is a radio transmitter arranged to transmit information representative of the applied pulses.

A simple and convenient way of transmitting the required information is to apply an audio frequency signal coincident with the pulses, as a modulation to a radio transmitter, enabling a conventional speech communication link to be employed. Thus a test set for use in the present invention, in its simplest form, may comprise means for applying a sequence of d.c. pulses to a sheath of a cable with means for producing audio frequency signals, e.g. a tone or buzz, coincident with the pulses.

For detecting the magnetic field due to the fault current through the sheath, a portable magnetometer having a visual indicator is employed in combination with a portable radio receiver to receive signals from the transmitter. The magnetometer may be of the type having "backing-off" means such that the indicated output represents the difference between the detected field and an adjustable "backing-off" level which is set in accordance with the standing field in the vicinity. This "backing-off" level may be determined automatically using a magnetometer with a sufficiently long time constant. The portable magnetometer may be of the flux gate type having a sensing winding and an autobalance winding, the output of the autobalance winding being applied via a time-delay smoothing circuit to provide a backing-off field.

Alternatively a field gradient type of magnetometer may be used having two probes which, in operation, are spaced apart, the magnetometer having an indicator showing the difference of the fields at the two probes. By setting up the two probes a known distance apart, the output is representative of the gradient of the magnetic field.

The magnetometer operator may be provided with means for controlling operation of the test set generating the d.c. pulses applied to the line; for example, a radio control link might be employed. However, it is often convenient to have a second operator at or in the neighbourhood of the pulse generator, the radio link providing voice communication between the operators. In this case the second operator can initiate pulse generation on receipt of a command from the magnetometer operator. It will be noted however that the required synchronization is effected by the transmission of the signal, e.g. the tone or buzz, indicative of the periods of current application so that this synchronizing is wholly independent of any delays by the operators.

In the following description, given by way of example, reference will be made to the accompanying drawing, in which.

Figure 1:
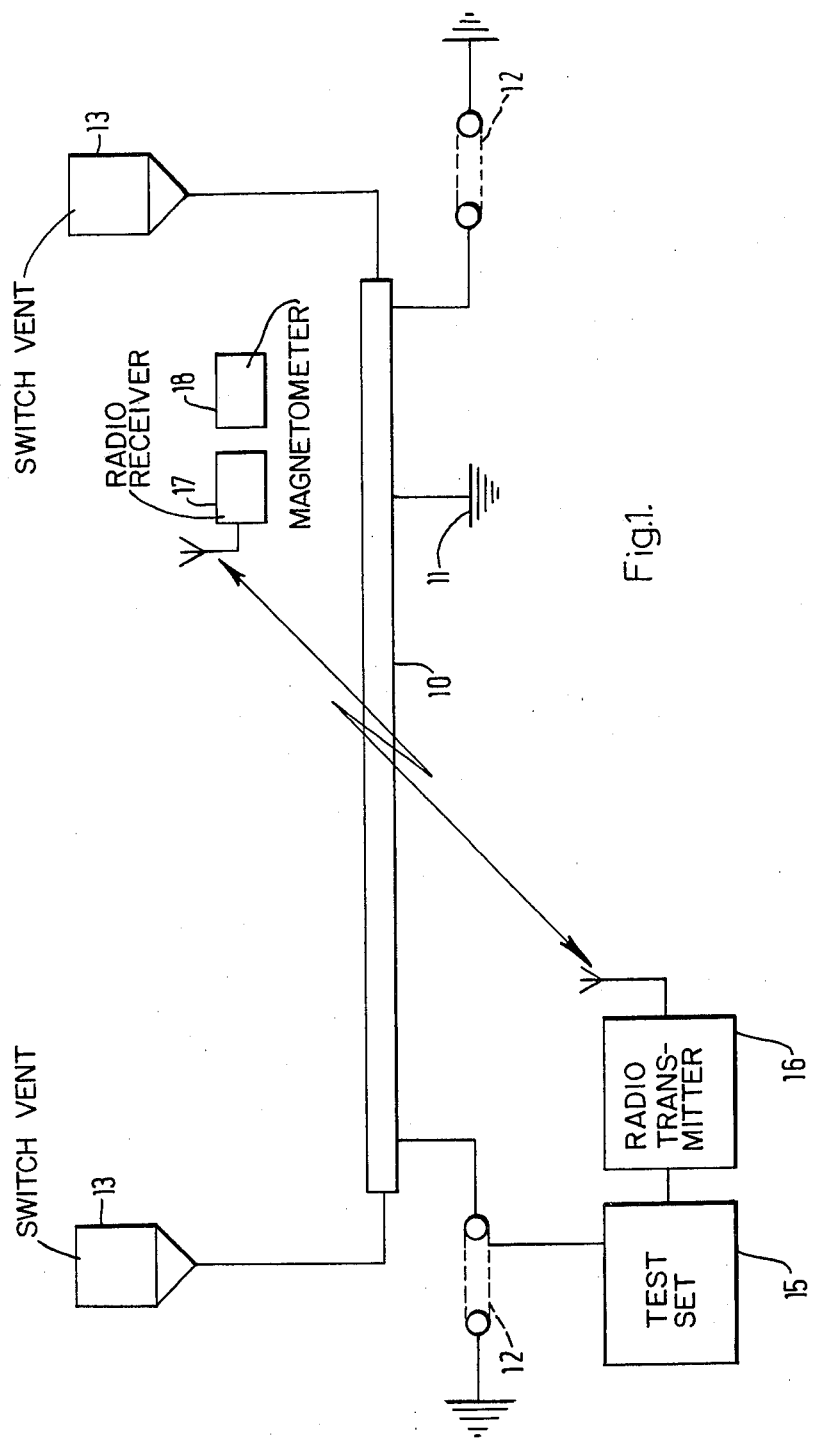
FIG. 1 is a diagram illustrating a method of fault location.

Referring to FIG. 1, there is illustrated diagrammatically an underground cable 10 having an earth fault 11 which is to be located. The sheath will be earthed at each end as shown at 12, and it is necessary that the earth links be removed before starting to locate the fault. The cable, as previously explained, is typically a multi-core cable with the cores separately insulated and together surrounded by a series of concentric layers, typically of belting insulation, a metallic sheath, an oversheath of polyvinylchloride or similar material and an outer graphite coating. The present invention is concerned with the detection of an earth fault on the metallic sheath.

FIG. 1 illustrates a length of high-voltage cable 10, operated typically at 33 kV and extending between switch units 13 where access can be obtained to the ends of the cable. The cable cores must be dead and unearthed for the duration of the fault location. At one end, a test set 15, to be described in further detail later, is connected to the cable sheath for applying coded d.c. pulses to the cable sheath with respect to earth. At or near this point, there is also provided a radio transmitter 16 for communication to a portable radio receiver 17 used by an operator with a portable magnetometer 18. This magnetometer is used to sense the magnetic field due to the pulse current in the sheath. Typically the magnetometer operator starts half way along the cable; if the current is detected at that point, the fault is beyond that point whereas, if no current is detected, the fault is between the input end and the sensing point. The faulty half of the cable can then be similarly examined. Thus the known faulty section is halved and halved again until it is reduced to a length of a few meters. Pin-pointing the fault may then be done by the known pool-of-potential technique.

Figure 2:
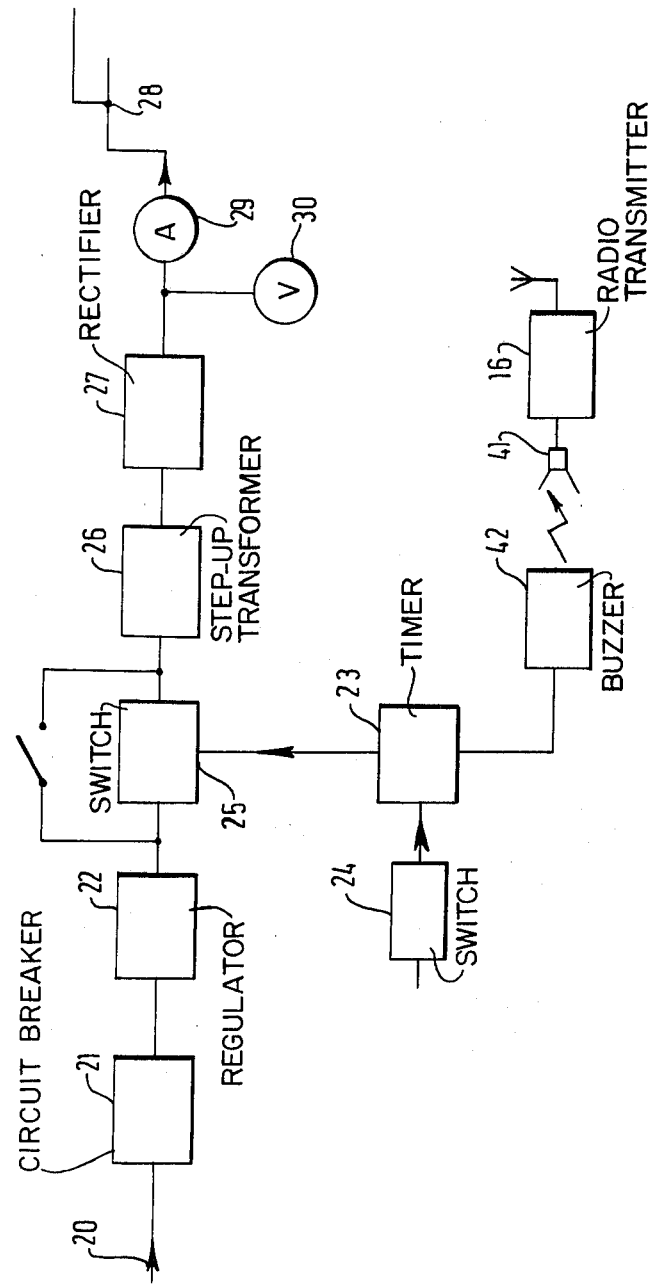
FIG. 2 is a block diagram illustrating in further detail part of the apparatus of FIG. 1.

The test set for applying the pulses is shown in further detail in FIG. 2. This set is energized from an alternating current means supply 20, typically 240 V 50 Hz via a circuit breaker 21 and regulator 22. The circuit breaker 21 is for protection purposes in case the fault conditions change. The pulses to be applied, in this embodiment, are a succession of three pulses each of 1 second duration with a 1 second interval between the pulses. These pulses are generated by a timer 23 controlled by a press-button switch 24 operation of which initiates a sequence of these pulses. The timer 23 controls a switch 25 so that the alternating supply at 20 is applied to a step-up transformer 26, conveniently giving a controllable output up to say 1500 V. The pulsed alternating output from the transformer 26 is rectified by a rectifier 27. The d.c. output is applied to the cable sheath at 28 via a current indicator 29. A voltage indicator 30 indicates the applied voltage.

Instead of using a transformer and rectifier, the pulses might be generated by a charge/discharge sequence of a capacitor.

Associated with the pulse generator is a radio transmitter 16 arranged for transmitting signals modulated at audio frequency from a microphone 41. The timer 23 also controls a buzzer 42 adjacent the microphone 41 so that an audio-frequency signal is transmitted for the duration of each of the applied pulses.

The optimum position for locating the radio transmitter may have to be a short distance from the cables and it is convenient for the operator to be adjacent the radio transmitter, with flexible connecting leads of appropriate length for controlling the apparatus.

The magnetometer operator receives the radio transmissions and hears the audio signals by loudspeaker or conveniently on headphones, which are synchronized with the applied pulses. The magnetometer is conveniently of the fluxgate type either with automatic back-off of standing fields or for measuring the field gradient.

To carry out a test, it is possible to use a current of about 300 mA instead of a current of about 50 mA usually employed because such a current can be passed through the sheath in short duration pulses without serious burning of the cable sheath. The regulator 22 enables the current to be adjusted. When the magnetometer operator has set up his equipment, he calls the test set controller over the radio link. The test set controller operates switch 24 to produce the coded sequence of pulses; the magnetometer operator hears the synchronized audio signal and can look for a sympathetic response on the magnetometer. Typically the three pulses in one sequence are adequate to detect current flow. Thus commonly as little as 20 to 30 pulses in all may be required and, in practice no excessive burning of the sheath occurs.

What we claim as our invention is:

1. A method of locating an earth fault on a sheath of an underground cable comprising the steps of applying pulses of direct current to said sheath at one location on the cable; searching at spaced locations along the route of the cable for the magnetic field due to a fault current to earth flowing in said sheath which is produced by said applied d.c. pulses using a portable magnetometer, with a visual indicator; and at each of said spaced locations, comparing the visual indications on the magnetometer with the periods of application of the pulses to the sheath by transmitting signals indicative of the periods of current application and using, with the portable magnetometer, a portable receiver arranged to receive the transmitted signals so that the magnetometer indications can be compared with the received signals until said visual indications on the magnetometer and said periods of application of the pulses substantially correspond, thereby identifying the approximate position of the earth fault along the cable.

2. A method as claimed in claim 1, wherein said pulses comprises a plurality of uniformly spaced pulses of uniform duration.

3. A method as claimed in claim 1, wherein said signals indicative of the periods of current application are transmitted over at least one core of the cable.

4. A method as claimed in claim 1, wherein said signals indicative of the periods of current application are transmitted by a radio transmitter and wherein said transmitted signals are received by a radio receiver in the vicinity of the magnetometer.

5. A method as claimed in claim 4, wherein said radio receiver is arranged to produce audio frequency pulses coincident with the applied d.c. pulses.

6. A method as claimed in claim 5, wherein audio frequency signals are generated at said one location for transmission as a modulation on the radio signals.

7. A method as claimed in claim 1, wherein the d.c. pulses are applied to the sheath by a quartz clock synchronized with a second quartz clock which is used with the portable magnetometer, in such a way that the visual indications on the magnetometer can be compared with the applied d.c. pulses by reference to the second clock.

8. Apparatus for locating an earth fault on a sheath of an underground cable comprising means for applying pulses of direct current to a sheath, means for producing synchronizing signals coincident with the d.c. pulses, a portable magnetometer, with a visual indicator, for searching for the magnetic field due to a fault current to earth flowing in the sheath and, associated with the magnetometer, a portable receiver for receiving the synchronized signals, the arrangement being such that visual indications on the magnetometer and said synchronized signals can be compared to identify the approximate position of the earth fault along the cable.

9. Apparatus for locating an earth fault on a sheath of an underground cable comprising means for applying pulses of direct current to a sheath, a radio transmitter arranged to transmit information representative of the applied d.c. pulses, a portable magnetometer, with a visual indicator, for searching for the magnetic field due to a fault current to earth flowing in the sheath and, associated with the magnetometer, a radio receiver for receiving the transmitted information, the arrangement being such that visual indications on the magnetometer and said transmitted information can be compared to identify the approximate position of the earth fault along the cable.

10. Apparatus as claimed in claim 9, wherein the apparatus also includes means for producing audio frequency pulses coincident with the applied d.c. pulses, said radio transmitter being arranged to transmit audio frequency pulses as modulation.

* * * * *

UNITED STATES PATENT AND TRADEMARK OFFICE
CERTIFICATE OF CORRECTION

PATENT NO. : 4,370,610
DATED : January 25, 1983
INVENTOR(S) : KENNETH R. ALLEN, JOHN K. ALLEN and GORDON R. McNALLY It is certified that error appears in the above-identified patent and that said Letters Patent are hereby corrected as shown below:

Column 1, line 24, after "faults", "or" should be --on--.

Column 1, line 43, "aranged" should be --arranged--.

Column 1, line 47, "therebey" should be --thereby--.

Claim 2, column 4, line 67, "comprises" should be --comprise--.

Signed and Sealed this

Twelfth Day of April 1983

[SEAL]

Attest:

GERALD J. MOSSINGHOFF

Attesting Officer　　Commissioner of Patents and Trademarks